United States Patent [19]

Watabe

[11] Patent Number: 5,714,949
[45] Date of Patent: Feb. 3, 1998

[54] PRIORITY ENCODER AND VARIABLE LENGTH ENCODER USING THE SAME

[75] Inventor: Akihiro Watabe, Nara-ken, Japan

[73] Assignee: Matsushita Electric Industrial Co., Ltd., Kadoma, Japan

[21] Appl. No.: 584,769

[22] Filed: Jan. 11, 1996

[30] Foreign Application Priority Data

Jan. 13, 1995 [JP] Japan ................. 7-004082

[51] Int. Cl.[6] .................................. H03M 7/40
[52] U.S. Cl. ................. 341/67; 341/136; 341/160
[58] Field of Search ........................ 341/158, 159, 341/160, 136, 67

[56] References Cited

U.S. PATENT DOCUMENTS 4,348,741  9/1982  McAlister et al. ............... 364/900
5,260,706  11/1993 Chung ............................. 341/160
5,511,222  4/1996  Shiba et al. ..................... 395/800
5,602,545  2/1997  Ishii et al. ....................... 341/50

FOREIGN PATENT DOCUMENTS 3226016  10/1991  Japan .

Primary Examiner—Jeffrey A. Gaffin
Assistant Examiner—Jason L. W. Kost
Attorney, Agent, or Firm—Renner, Otto, Boisselle, Sklar

[57] ABSTRACT

A priority encoder for encoding input data by scanning the input data in a predetermined direction, includes: a first voltage section for charging a plurality of output lines to a first voltage level; a plurality of switching elements connected to the plurality of the output lines, each of the plurality of switching elements being turned on in accordance with a value of the input data; and a second voltage section for charging a selected one of the plurality of output lines to a second voltage level different from the first voltage level, through the switching elements which are turned on.

17 Claims, 9 Drawing Sheets

| Absolute value of input data 312 | Active word line | Category | VLC code 314 | Bit length of VLC code 315 | Bit length of additional bit(s) 313 |
|---|---|---|---|---|---|
| 0 | 6a | 0 | 00 | 2 | 0 |
| 1 | 6b | 1 | 01 | 2 | 1 |
| 2, 3 | 6c | 2 | 10 | 2 | 2 |
| 4~7 | 6d | 3 | 110 | 3 | 3 |
| 8~15 | 6e | 4 | 1110 | 4 | 4 |

PRIORITY ENCODER AND VARIABLE LENGTH ENCODER USING THE SAME

BACKGROUND OF THE INVENTION

1. Field of the Invention

The present invention relates to a priority encoder and a variable length encoder using the priority encoder.

2. Description of the Related Art

A priority encoder detects a position at which a bit having a value of "1" appears for the first time by scanning binary data along a direction from a most significant bit (MSB) to a least significant bit (LAB) or a direction from a least significant bit (LSB) to a most significant bit (MSB). Conventionally, a priority encoder is produced by deriving a standard form of the sum of products based on a truth table and by combining logical gates corresponding to the standard form of the sum of products.

Data, such as DC and AC components in JPEG (Joint Photographic Experts Group) and DC components in MPEG (Motion Picture Image Coding Experts Group), is encoded by classifying the data into a $2^n$ number of groups and by combining a variable length code corresponding to the classified group with additional bit(s) indicating an offset in the classified group. For example, data having a value of 0 is classified into "category 0", data having a value within −1 to 1 is classified into "category 1", and data having a value within −3 to 3 is classified into "category 2". In general, when an absolute value of the data is greater than or equal to $2^{n-1}$ and smaller than $2^n$, the data is classified into "category n". Herein, n denotes an integer. A variable length code is assigned to the data in the category in accordance with the number of the category. Additional bit(s) indicating an offset in the category (i.e., offset code) are also assigned to the data in the category. The value of the additional bit(s) is determined to increase as the value of the data increases in the category. Encoding is achieved by combining the variable length code with the additional bit(s). The bit length of the additional bit(s) in "category n" is n.

When a priority encoder is produced based on a standard form of the sum of products as mentioned above, the number of logical elements greatly increases in accordance with the increase in the number of bits of input data. This enlarges the scale of the circuit and increases the delay time of the circuit. For example, when a priority encoder is produced based on a standard form of the sum of products without using multiple stages of buffers, an additional (n+1) bits AND grate is required in a case where the number of bits of input data increases from n to (n+1). Accordingly, the number of the logical elements required for the priority encoder increases in an order of at least 2n. Herein, n denotes an integer.

Regarding the variable length encoding in JPEG and MPEG, the conventional method mentioned above requires two cycles in order to obtain a variable length code. One cycle is for obtaining a category corresponding to input data. The other cycle is for referencing a memory to obtain data including a variable length code corresponding to the category.

SUMMARY OF THE INVENTION

A priority encoder for encoding input data by scanning the input data in a predetermined direction of this invention includes: a first voltage section for charging a plurality of output lines to a first voltage level; a plurality of switching elements connected to the plurality of the output lines, each of the plurality of switching elements being turned on in accordance with a value of the input data; and a second voltage section for charging a selected one of the plurality of output lines to a second voltage level different from the first voltage level, through the switching elements which are turned on.

In one embodiment of the present invention, the plurality of switching elements includes: a first group of switches connected with each other in series, an on/off state of each of the switches in the first group being controlled in accordance with an inverted output of the input data, a switch positioned at an end in the first group is connected to the second voltage section; end a second group of switches for connecting the first group of switches with the plurality of output lines, an on/off state of each of the switches in the second group being controlled in accordance with a normal output of the input data.

In another embodiment of the present invention, the predetermined direction is one of a direction from a most significant bit to a least significant bit of the input data and a direction from the least significant bit to the most significant bit of the input data.

In still another embodiment of the present invention, after the first voltage section precharges the plurality of output lines, the second voltage section discharges the selected one of the plurality of output lines.

In still another embodiment of the present invention, after the first voltage section discharges the plurality of output lines, the second voltage section precharges the selected one of the plurality of output lines.

In still another embodiment of the present invention, the switching elements include an NMOS transistor.

In still another embodiment of the present invention, the priority encoder further includes a data storage section connected to the plurality of output lines, for outputting data corresponding to the selected one of the plurality of output lines.

Alternatively, a priority encoder for encoding input data by scanning the input data in a predetermined direction includes: a first encoding section for receiving a portion of the input data and-for outputting an encoded result of the portion of the input data; a second encoding section for receiving a remaining portion of the input data and for outputting an encoded result of the remaining portion of the input data; and a selecting section for selecting one of an output of the first encoding section and an output of the second encoding section based on whether all bits of the portion of the input data have a predetermined value, wherein the first encoding section includes: a first voltage section for charging a plurality of first output lines to a first voltage level; a plurality of first switching elements connected to the plurality of the first output lines, each of the plurality of first switching elements being turned on in accordance with a value of the portion of the input data; a second voltage section for charging a selected one of the plurality of first output lines to a second voltage level different from the first voltage level, through the first switching elements which are turned on; and a first data storage section connected to the plurality of first output lines, for outputting data corresponding to the selected one of the plurality of first output lines, and wherein the second encoding section includes: a third voltage section for charging a plurality of second output lines to a third voltage level; a plurality of second switching elements connected to the plurality of the second output lines, each of the plurality of second switching elements being turned on in accordance with a value of the remaining portion of the input data; a fourth voltage section for charging a selected one of the plurality of second output lines to a fourth voltage level different from the third voltage level, through the second switching elements which are turned on; and a second data storage section connected to the plurality of second output lines, for outputting data corresponding to the selected one of the plurality of second output lines.

In one embodiment of the present invention, the plurality of first switching elements includes: a first group of switches connected with each other in series, an on/off state of each of the switches in the first group being controlled in accordance with an inverted output of the portion of the input data, a switch positioned at an end in the first group is connected to the second voltage section; and a second group of switches for connecting the first group of switches with the plurality of first output lines, an on/off state of each of the switches in the second group being controlled in accordance with a normal output of the portion of the input data, and wherein the plurality of second switching elements includes: a third group of switches connected with each other in series, an on/off state of each of the switches in the third group being controlled in accordance with an inverted output of the remaining portion of the input data, a switch positioned at an end in the third group is connected to the fourth voltage section; and a fourth group of switches for connecting the third group of switches with the plurality of second output lines, an on/off state of each of the switches in the fourth group being controlled in accordance with a normal output of the remaining portion of the input data.

In another embodiment of the present invention, the predetermined direction is one of a direction from a most significant bit to a least significant bit of the input data and a direction from the least significant bit to the most significant bit of the input data.

In still another embodiment of the present invention, after the first voltage section precharges the plurality of first output lines, the second voltage section discharges the selected one of the plurality of first output lines.

In still another embodiment of the present invention, after the first voltage section discharges the plurality of first output lines, the second voltage section precharges the selected one of the plurality of first output lanes.

In still another embodiment of the present invention, after the third voltage section precharges the plurality of second output lines, the fourth voltage section discharges the selected one of the plurality second output lines.

In still another embodiment of the present invention, after the third voltage section discharges the plurality of second output lines, the fourth voltage section precharges the selected one of the plurality of second output lines.

In still another embodiment of the present invention, each of the first switching elements and the second switching elements includes an NMOS transistor.

In another aspect of the present invention, a variable length encoder includes: an input section for receiving input data consisting of a plurality of bits; an absolute value output section for outputting an absolute value of the input data; a priority encoding section for outputting data including a variable length code, a bit length of the variable length code and a bit length of an additional bit, based on a position of a bit having a predetermined value in the absolute value of the input data; an additional bit output section for outputting an additional bit based on the input data and the bit length of the additional bit; a variable length code output section for outputting a code obtained by combining the variable length code with the additional bit based on the bit length of the variable length code and the bit length of the additional bit, wherein the priority encoding section includes: an encoding section for selectively making one of a plurality of output lines active; end a data storage section connected to the plurality of output lines,. for outputting data corresponding to the output line which is made active by the encoding section.

In one embodiment of the present invention, the additional bit output section includes section for subtracting a sign bit of the input data form the input data.

Thus, according to the present invention, a plurality of word lines of the data storage section are precharged. Then, the ON/OFF states of the respective switches are controlled in accordance with a value of the input data. As a result, when the discharge is started, only one word line of the plurality of the word lines is discharged through the switches which are turned on. Data corresponding the respective word lines are previously stored in the data storage section. The data storage section outputs data corresponding to the discharged word line. Alternatively, the order of precharge and discharge may be reversed. The priority encoder according to the present invention has a small scale of circuit, since the priority encoder is mainly composed of switches.

Thus, the invention described herein makes possible the advantages of (1) providing a priority encoder having a relatively small number of logical elements and a small scale of circuitry and (2) providing a priority encoder which requires only one cycle to obtain a variable length code from input data, and a variable length encoder using the priority encoder.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the drawings. Throughout the following examples, identical components bear identical reference numbers.

EXAMPLE 1

Figure 1:
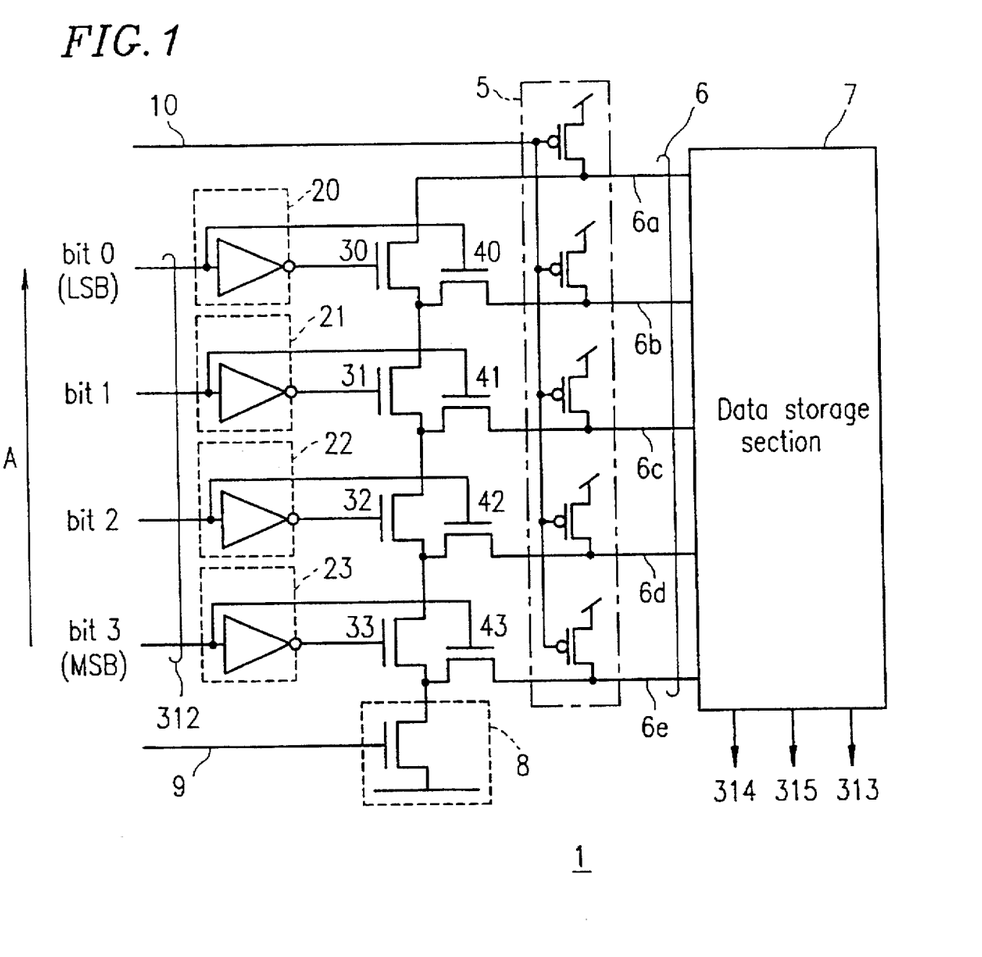
FIG. 1 is a view showing a configuration for a priority encodes 1 of Example 1 according to the present invention.

FIG. 1 shows a configuration of a priority encoder 1 of Example 1 according to the present invention, in a case where input data 312 consists of four bits. The priority encoder 1 has a function for detecting a position at which a bit having a value of "1" appears for the first time by scanning the input data 312 along a direction from a most significant bit (MSB) to a least significant bit (LSB), and for making one word line corresponding to the detected position among a plurality of word lines 6 (6a to 6e) active. The scanning direction is indicated by an arrow A in FIG. 1.

The bits of the input data 312 are input to data buffers 20 to 23, respectively. Specifically, the input data 312 includes bit 0 (LSB) to bit 3 (MSB). The bit 0 (LSB) Of the input data 312 is input to the data buffer 20. The bit 1 of the input data 312 is input to the data buffer 21. The bit 2 of the input data 312 is input to the data buffer 22. The bit 3 (MSB) of the input data 312 is input to the data buffer 23.

Each of the data buffers 20 to 23 generates a normal output of the input data 312 and an inverted output of the input data 312. Herein, a normal output of the input data 312 is defined as data having identical values of bits as the input data 312, whereas an inverted output of the input data 312 is defined as data having inverted values of bits as the input data 312. For example, when the input data 312 is 0101, the normal output of the input data 312 is 0101 and the inverted output of the input data 312 is 1010.

The bits of the inverted output of the input data 312 are output to the gates of switches 30 to 33, respectively. The switches 30 to 33 are controlled so that the switches 30 to 33 are turned on when the input to the gates of the switches 30 to 33 are high and that the switches 30 to 33 are turned off when the input to the gates of the switches 30 to 33 are low. Accordingly, the switches 30 to 33 may be NMOS transistors as shown in FIG. 1.

The switches 30 to 33 are connected with each other in series and constitute a first switch group. The switch 30 is positioned at one end of the first switch group. The drain of the switch 30 is connected to a word line 6a. The word line 6a is used to indicate that there are no bits having a value of "1" among the bits of the input data 312. The switch 33 is positioned at the other end of the first switch group. The source of the switch 33 is connected to a discharge section 8.

The bits of the normal output of the input data 312 are output to the gates of switches 40 to 43, respectively. The switches 40 to 43 are controlled so that the switches 40 to 43 are turned on when the inputs to the gates of the switches 40 to 43 are high and that the switches 40 to 43 are turned off when the inputs to the gates of the switches 40 to 43 are low. Accordingly, the switches 40 to 43 may be NMOS transistors as shown in FIG. 1.

The switches 40 to 43 constitute a second switch group. The switches 40 to 43 connect the switches 30 to 33 in the first switch group to the word lines 6. Specifically, one end of each switch 40 to 43 is connected to the source of each switch 30 to 33, respectively. The other end Of each switch 40 to 43 is connected to each word line 6b to 6e, respectively.

A discharge control signal 9 is input to the discharge section 8. The discharge section 8 performs discharge when the discharge control signal 9 is "1" (high).

A precharge control signal 10 is input to the precharge section 5. The precharge section 5 precharges a plurality of word lines 6 when the precharge control signal 10 is "0" (low). The plurality of word lines 6 are connected to a data storage section 7.

Data corresponding to the respective word lines 6 are previously stored in the data storage section 7. The data storage section 7 outputs data corresponding to one word line which is made active among the plurality of word lines 6.

Hereinafter, the operations of the priority encoder 1 having the configuration mentioned above will be described with reference to FIGS. 2 to 4.

Figure 2:
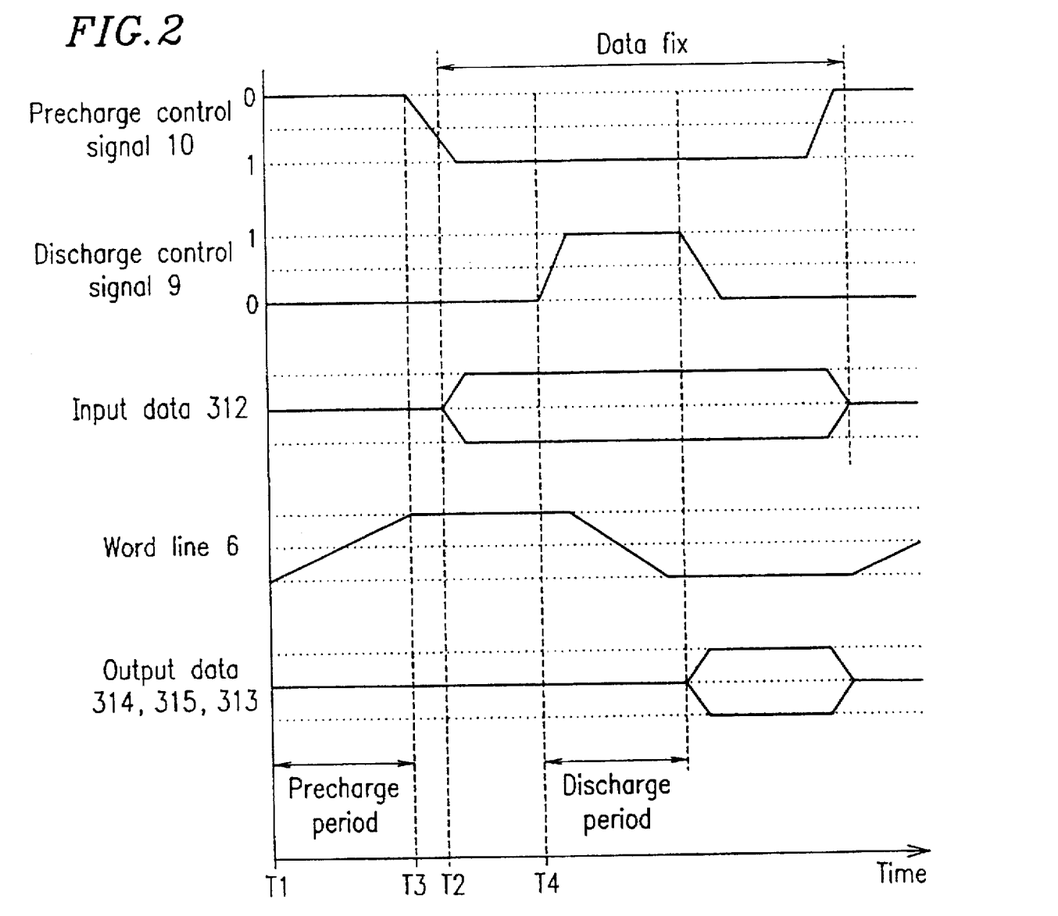
FIG. 2 is a timing chart showing the timings of the respective signals in the priority encoder 1.

FIG. 2 is a timing chart showing a relationship between the precharge control signal 10, the discharge control signal 9, the input data 312, the word lines 6 and the output data 314, 315 and 313.

As shown in FIG. 2, at a starting point of the operation of the priority encoder 1, the level of the precharge control signal 10 is "0" (low) and the level of the discharge control signal 9 is "0" (low) at time T1. As a result, the precharge section 5 is controlled to start the precharge operation, whereas the discharge section 8 is controlled not to start the discharge operation. The precharge section 5 precharges all of the word lines 6 up to a first voltage level.

The input data 312 is input to the data buffers 20 to 23 and a value for the input data 312 is fixed at time T2. The data buffers 20 to 23 provide the normal output of the input data 312 with the switches 40 to 43 and provide the inverted output of the input data 312 with the switches 30 to 33.

The level of the precharge control signal 10 is changed from "0" (low) to "1" (high) at time T3, and the level of the discharge control signal 9 is changed from "0" (low) to "1" (high) at time T4. As a result, the precharge section 5 is controlled to stop the precharge operation, whereas the discharge section 8 is controlled to start the discharge operation.

Before the discharge section 8 starts the discharge operation, the ON/OFF state of each of the switches 30 to 33 in the first switch group is determined based on a value of the inverted output of the input data 312. For example, when the input data 312 is 0101 in the order from MSB to LSB, the inverted output of the input data 312 is 1010 in the same order. As a result, the switches 31 and 33 are turned on and the switches 30 and 32 are turned off.

Before the discharge section 8 starts the discharge operation, the ON/OFF state of each of the switches 40 to 43 in the second switch group is also determined based on a value of the normal output of the input data 312. For example, when the input data 312 is 0101 in the order from MSB to LSB, the normal output of the input data 312 is 0101 in the same order. As a result, the switches 40 and 42 are turned on and the switches 41 and 43 are turned off.

The discharge section 8 discharges one word line up to a second voltage level which is different from the first voltage level among the plurality of word lines 6, through the switches which are turned on among the switches 30 to 33 in the first switch group and the switches 40 to 43 in the second switch group.

Under the condition of the timings of the operations mentioned above, a specified word line 6 is discharged if and only if a switch corresponding to the specified word line 6 is turned on among the switches 40 to 43 in the second switch group and all of the switches corresponding to higher bits than a bit corresponding to the specified word line 6 are turned on among the switches 30 to 33 in the first switch group. This means that only one word line 6 is discharged and that the discharged word line 6 corresponds to a position at which a bit having a value of "1" appears for the first time by scanning the input data along a direction from MSB to LSB. In this context, please note that discharging a word line 6 is equivalent to making the word line 6 active.

Specifically, when the bit 3 (MSB) of the input data 312 has a value of 1, only one word line 6e is discharged. When the bit 3 of the input data 312 has a value of 0 and the bit 2 of the input data 312 has a value of 1, only one word line 6d is discharged. When the bits 3 and 2 of the input data 312 each has a value of 0 and the bit 1 of the input data 312 has a value of 1, only one word line 6c is discharged. When the bits 3, 2 and 1 of the input data 312 each has a value of 0 and the bit 0 (LSB) of the input data 312 has a value of 1, only one word line 6b is discharged. When the bits 3, 2, 1 and 0 of the input data 312 each has a value of 0, only one word line 6a is discharged.

For example, it is assumed that the input data 312 is 0101 in the order from MSB to LSB. In this case, the switches 31 and 33 in the first switch group are turned on, and the switches 40 and 42 in the second switch group are turned on. The remaining switches are maintained in the "off" position.

Since the switch 32 in the first switch group As turned off, the word lines 6b and 6c corresponding to the switches 40 and 41 in the second switch group and the word line 6a are not discharged by the discharge section 8. Since the switch 43 in the second switch group is turned off, the word line 8e corresponding to the switch 43 in the second switch group is not discharged by the discharge section 8, either.

On the other hand, since the switch 33 in the first switch group is turned on and the switch 42 in the second switch group is turned on, the word line 6d corresponding to the switch 42 in the second switch group is discharged by the discharge section 8. Thus, only one word line 6d is discharged. The discharged word line 6d corresponds to a position of the bit 2 at which a bit having a value of "1" appears for the first time by scanning the input data 312 along a direction from MSB to LSB.

Data corresponding to the respective word lines 6 are previously stored in the data storage section 7.

Figure 3:
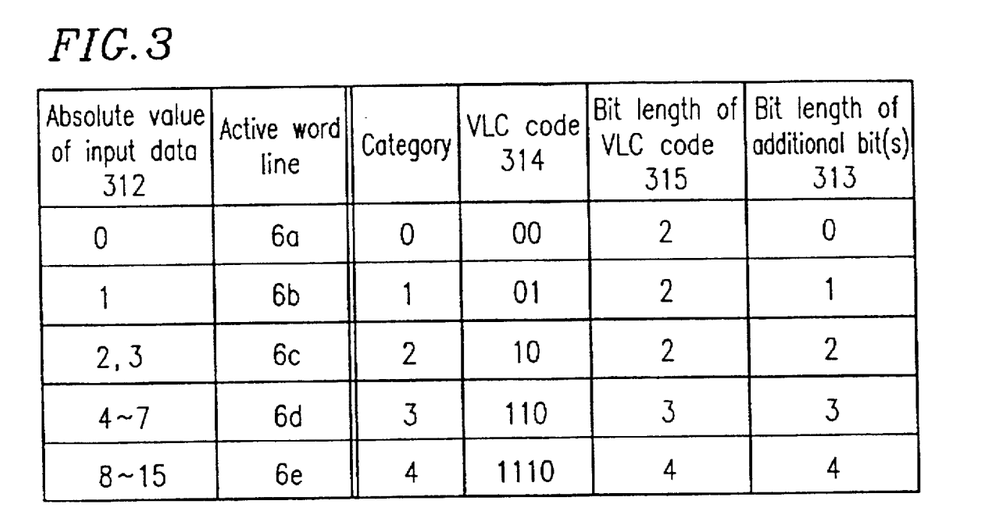
FIG. 3 is a view showing data stored in a data storage section 7 of the priority encoder 1.

FIG. 3 shows a relationship between categories of variable length codes and data stored in the data storage section 7. The data stored in the data storage section 7 consists of a plurality of bits and includes a variable length code 314, a bit length of the variable length code 315 and a bit length of the additional bit(s) 313. The data storage section 7 judges which category the input data 312 belongs to, in accordance with which word line is made active among the plurality of word lines 6. As a result, the data storage section 7 outputs data 314, 315 and 313 corresponding to the category to which the input data 312 belongs.

For example, when the word line 6e is made active, the data storage section 7 judges that the input data 312 belongs to "category 4" by referencing to the table shown in FIG. 3, and outputs data 314, 315 and 313 corresponding to "category 4". Specifically, "1101" as data 314, "4" as data 315 and "4" as data 313 are output from the data storage section 7. This example corresponds to a case where an absolute value of the input data 312 is within a range of 8 to 15.

In Example 1, the number of bite of the input data 312 is four. However, the present invention is not limited to the number of bits of input data. The present invention is applicable to a priority encoder which deals with any number of bits of input data.

in Example 1, the switches 30 to 33 in the first switch group are connected in series. Because of this, the increase in the number of transistors is restricted even when the number of bits of the input data 312 is increased. This is an advantage in circuit scale.

Figure 4:
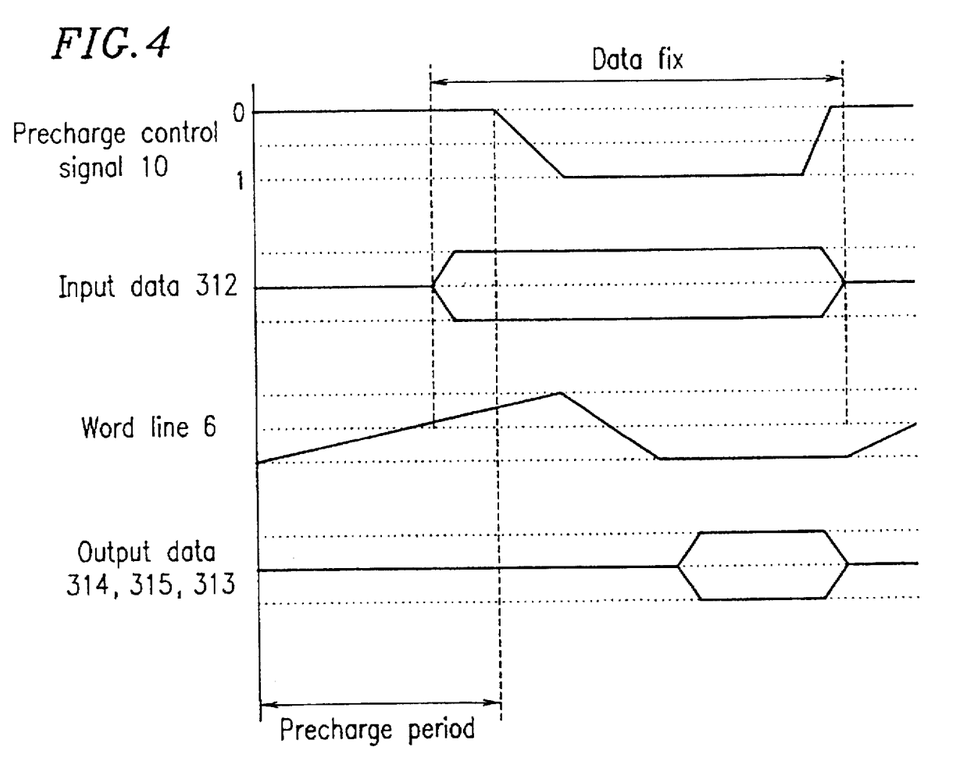
FIG. 4 is another timing chart showing the timings of the respective signals in the priority encoder 1.

Further, the priority encoder 1 may be modified so that the input data 312 is input to the priority encoder 1 during a period in which the word lines 6 are precharged by the precharge section 5. FIG. 4 shows the timings of the respective signals in this alternative.

EXAMPLE 2

Figure 5:
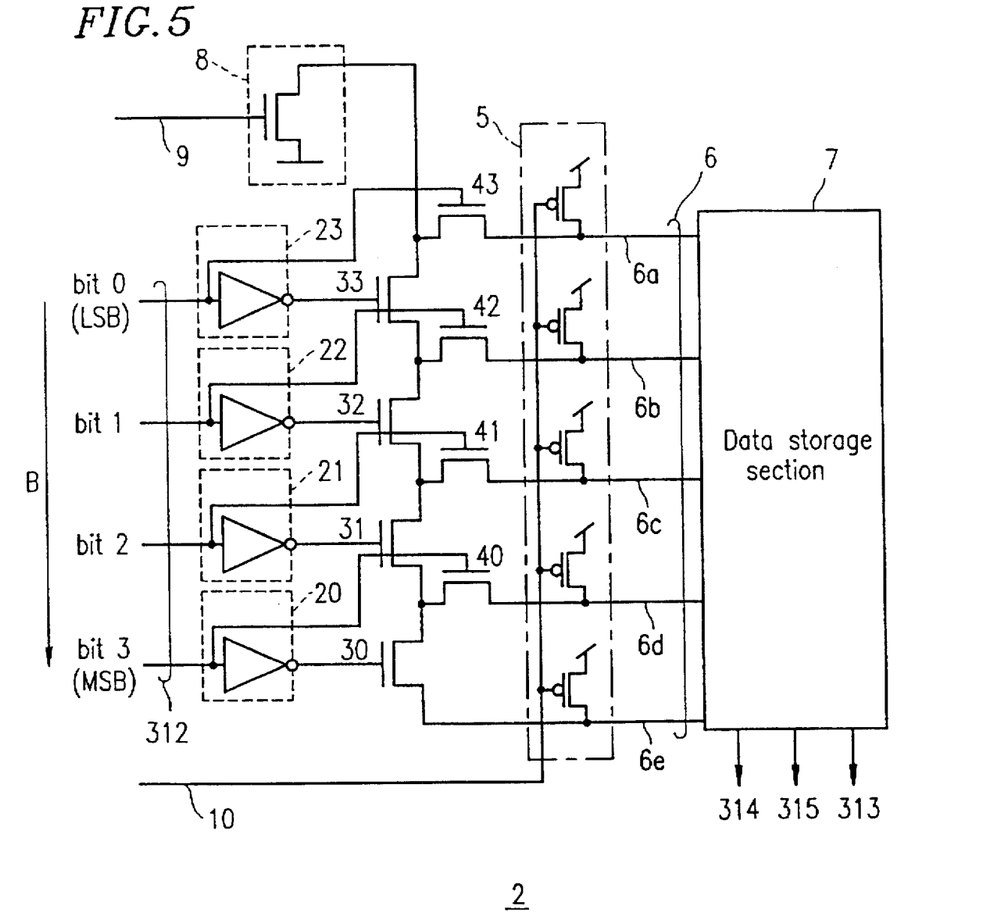
FIG. 5 is a view showing a configuration for a priority encoder 2 of Example 2 according to the present invention.

FIG. 5 shows a configuration for a priority encoder 2 of Example 2 according to the present invention. The priority encoder 2 has a function for detecting a position at which a bit having a value of "1" appears for the first time by scanning the input data 312 along a direction from a least significant bit (LSB) to a most significant bit (MSB), and for making one word line corresponding to the detected position among a plurality of word lines 6 (6a to 6e) active. The scanning direction is indicated by an arrow B in FIG. 5.

The function of the priority encoder 2 is different from that of the priority encoder 1 shown in FIG. 1 in the scanning direction of the input data 312.

According to the priority encoder 2, after all of the word lines 6 are precharged by the precharge section 5, only one word line 6 is discharged by the discharge section 8 in accordance with the value of the input data 312. The discharged word line 6 corresponds to the position at which a bit having a value of "1" appears for the first time by scanning the input data 312 along a direction from LSB to MSB.

Specifically, when the bit 0 (LSB) of the input data 312 has a value of 1, only one word line 6a is discharged. When the bit 0 of the input data 312 has a value of 0 and the bit 1 of the input data 312 has a value of 1, only one word line 6b is discharged. When the bits 0 and 1 of the input data 312 each has a value of 0 and the bit 2 of the input data 312 has a value of 1, only one word line 6c is discharged. When the bits 0, 1 and 2 of the input data 312 each has a value of 0 and the bit 3 (MSB) of the input data 312 has a value of 1, only one word line 6d is discharged. When the bits 0, 1, 2 and 3 of the input data 312 each has a value of 0, only one word line 6e is discharged.

EXAMPLE 3

Figure 6:
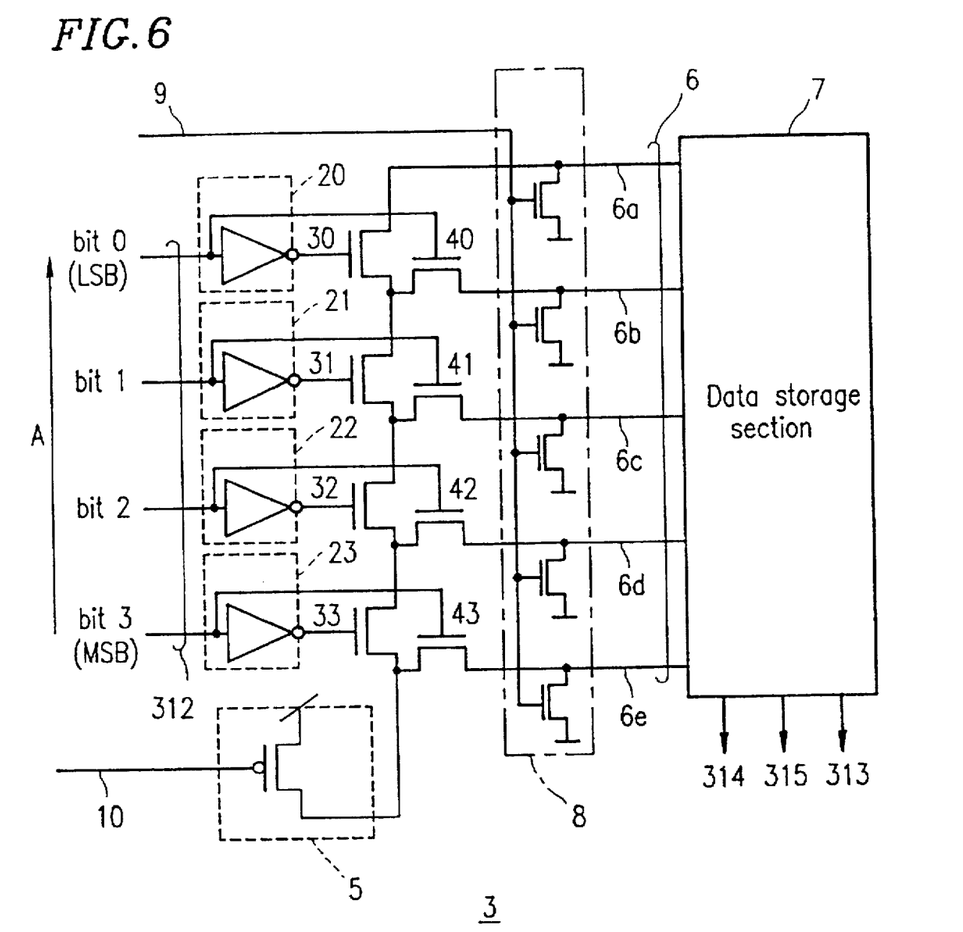
FIG. 6 is a view showing a configuration for a priority encoder 3 of Example 3 according to the present invention.

FIG. 6 shows a configuration for a priority encoder 3 of Example 3 according to the present invention. The priority encoder 3 has a function for detecting the position at which a bit having a value of "1" appears for the first time by scanning the input data 312 along a direction from a most significant bit (MSB) to a least significant bit (LSB), and for making one word line corresponding to the detected position among a plurality of word lines 6 (6a to 6e) active. The scanning direction is indicated by an arrow A in FIG 6.

The priority encoder 3 is different from the priority encoder 1 shown in FIG. 1 in that after all of word lines 6 are discharged, only one word line 6 is precharged.

According to the priority encoder 3, after all of the word lines 6 are discharged by the discharge section 8, only one word line 6 is precharged by the precharge section 5 in accordance with a value of the input data 312. The precharged word line 6 corresponds to the position at which a bit having a value of "1" appears for the first time by scanning the input data 312 along a direction from MSB to LSB.

Specifically, when the bit 3 (MSB) of the input data 312 has a value of 1, only one word line 6e is precharged. When the bit 3 of the input data 312 has a value of 0 and the bit 2 of the input data 312 has a value of 1, only one word line 6d is precharged. When the bits 3 and 2 of the input data 312 each has a value of 0 and the bit 1 of the input data 312 has a value of 1, only one word line 6c is precharged. When the bits 3, 2 and 1 of the input data 312 each has a value of 0 and the bit 0 (LSB) of the input data 312 has a value of 1, only one word line 6b is precharged. When the bits 3, 2, 1 and 0 of the input data 312 each has a value of 0, only one word line 6a is precharged.

In the context of Example 3, please note that precharging a word line 6 is equivalent to making the word line 6 active.

EXAMPLE 4

Figure 7:
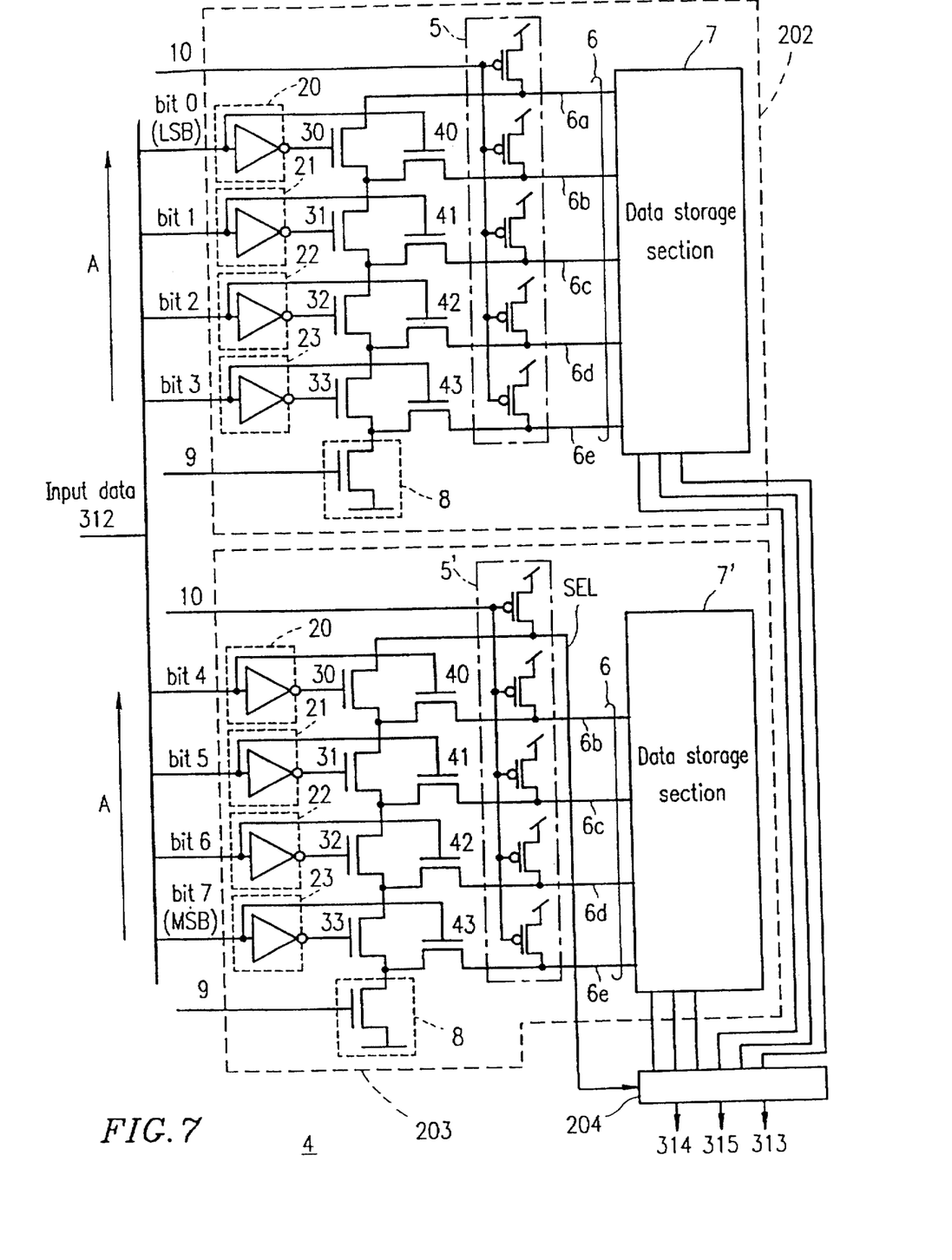
FIG. 7 is a view showing a configuration for a priority encoder 4 of Example 4 according to the present invention.

FIG. 7 shows a configuration for a priority encoder 4 of Example 4 according to the present invention, in a case where the input data 312 consists of eight bits. The priority encoder 4 has a function for detecting a position at which a bit having a value of "1" appears for the first time by scanning the input data 312 along a direction from a most significant bit (MSB) to a least significant bit (LSB). The scanning direction is indicated by an arrow A in FIG. 7.

The priority encoder 4 divides the input data 312 into an upper bit portion consisting of an upper four bits and a lower bit portion consisting of a lower four bits, and encodes the upper bit portion and the lower bit portion, respectively.

By dividing the input data 312 mentioned above, the reduction of operation speed due to the increase in the chain of the transistors is restricted, even when the number of bits of the input data 312 increases. In the Example 4, an example in which the input data 312 is divided into two portions will be described. However, the present invention is applicable to a case as where the input data 312 is divided into more than two portions.

The priority encoder 4 includes a priority encoder 202 for encoding a lower bit portion of the input data 312, a priority encoder 203 for encoding an upper bit portion of the input data 312, and an output selector 204 for selectively outputting one of the output of the priority encoder 202 end the output of the priority encoder 203 based on whether all bits of the upper bit portion of the input data 312 have a value of 0 or not.

In the example shown in FIG. 7, the priority encoder 202 has the same configuration as the priority encoder 1 shown in FIG. 1. Alternatively, the priority encoder 202 may have the same configuration as any of the priority encoders 2 and 3 shown in FIGS. 5 and 6. Accordingly, the explanation of the configuration of the priority encoder 202 will be omitted herein.

In the example shown in FIG. 7, the priority encoder 203 has the same configuration as the priority encoder 1 shown in FIG. 1, except for connecting the switch 30 in the first switch group to the output selector 204 through a signal line SEL instead of connecting the switch 30 in the first switch group to the word line 6a. Alternatively, the priority encoder 203 may have the same configuration as any of the priority encoders 2 and 3 shown in FIGS. 5 and 6, except for the same.

When all bits of the upper bit portion of the input data 312 have a value of 0, the switches 30 to 33 in the first switch group are turned on in the priority encoder 203. As a result, a signal line SEL is connected to the discharge section 8 in the priority encoder 203. Thus, the signal line SEL is discharged and the level of the signal line SEL becomes low. On the contrary, when at least one bit of the upper bit portion of the input data 312 has a value of 1, the level of the signal line SEL remains high. Thus, the signal line SEE is used to judge whether all bits of the upper bit portion of the input data 312 have a value of 0 or not.

The output selector 204 selects the output of the priority encoder 202 when the signal line SEL is in a low level. The output selector 204 selects the output of the priority encoder 203 when the signal line SEL is in a high level.

The precharge operation by the precharge section 5 in the priority encoder 202 is independent from the precharge operation by the precharge section 5' in the priority encoder 203. Accordingly, the voltage level of the word lines 6 precharged by the precharge section 5 in the priority encoder 202 may be identical with or different from the voltage level of the word lines 6 precharged by the precharge section 5' in the priority encoder 203.

The discharge operation by the discharge section 8 in the priority encoder 202 is independent from the discharge operation by the discharge section 8 in the priority encoder 203. Accordingly, the voltage level of the word lines 6 discharged by the discharge section 8 in the priority encoder 202 may be identical with or different from the voltage level of the word lines 6 discharged by the discharge section 8 in the priority encoder 203.

EXAMPLE 5

Figure 8:
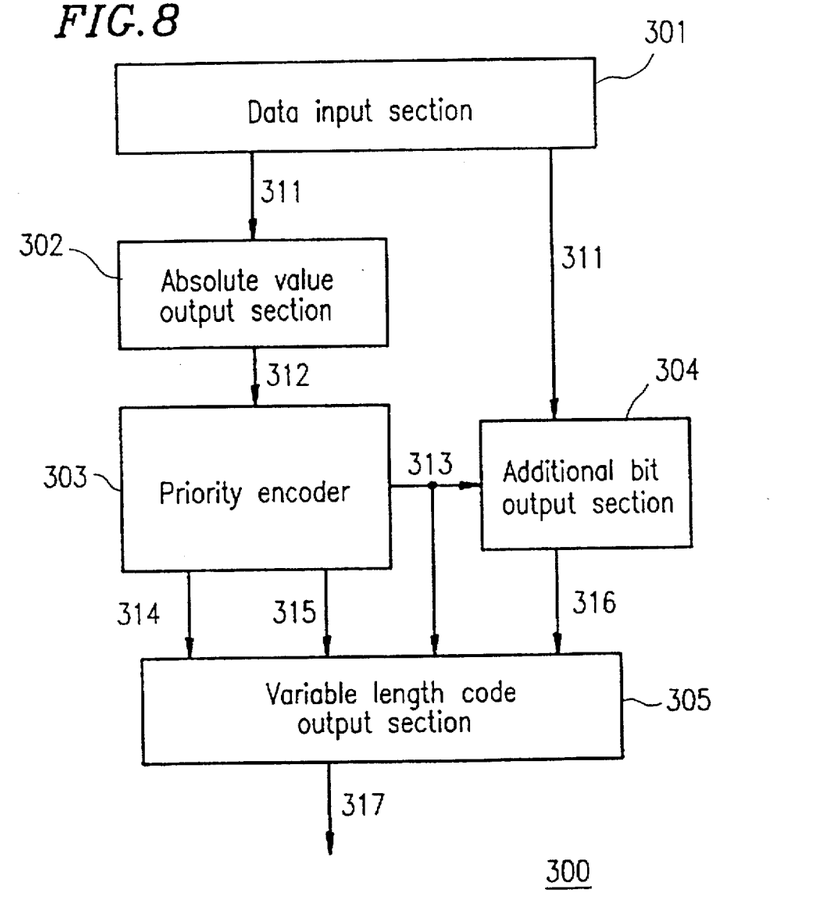
FIG. 8 is a view showing a configuration for a variable length encoder 300 according to the present invention.

FIG. 8 shows a configuration for a variable length encoder 300 using a priority encoder according to the present invention.

Input data 311 is input from a data input section 301. The input data 311 is input to an absolute value output section 302 and an additional bit output section 304.

The absolute value output section 302 calculates an absolute value for the input data 311 and outputs the calculated result as an absolute value 312. The absolute value 312 is input to a priority encoder 303.

The priority encoder 303 outputs a variable length code 314, a bit length of the variable length code 315 and a bit length of additional bit(s) 313 based on a position of bit which has a predetermined value (e.g. "1") in the absolute value 312 of the input data 311.

The configuration of the priority encoder 303 is the same as that of any of the priority encoders described in Examples 1 to 4. Accordingly, the explanation of the configuration of the priority encoder 303 will be omitted herein.

By using any of the priority encoders described in Examples 1 to 4 as a priority encoder 303, data corresponding to the encoded result of the absolute value 312 of the input data 311 is directly output from the data storage section 7. This output requires only one cycle from inputting data to obtaining a variable length code. Accordingly, this provides an advantage of improving the operation speed of the variable length encoder. Also, the use of any of the priority encoders described in Example 1 to 4 provides the advantage of reducing the circuit scale of the variable length encoder.

The additional bit output section 304 subtracts a sign bit of the input data 311 from the input data 311, and outputs data 316 based on the subtracted result and the data 313. The data 318 is a portion of the subtracted result which is obtained by taking the subtracted result in the order from LSB to MSB by a length indicated by the bit length of the additional bit(s) 313. The subtraction of a sign bit of the input data 311 from the input data 311 is achieved by performing no operation when the sign bit of the input data 311 has a value of 0 and by subtracting "1" (i.e., adding "11111111" when the data is represented in twos complement form) when the sign bit of the input data 311 has a value of 1.

Figure 9:
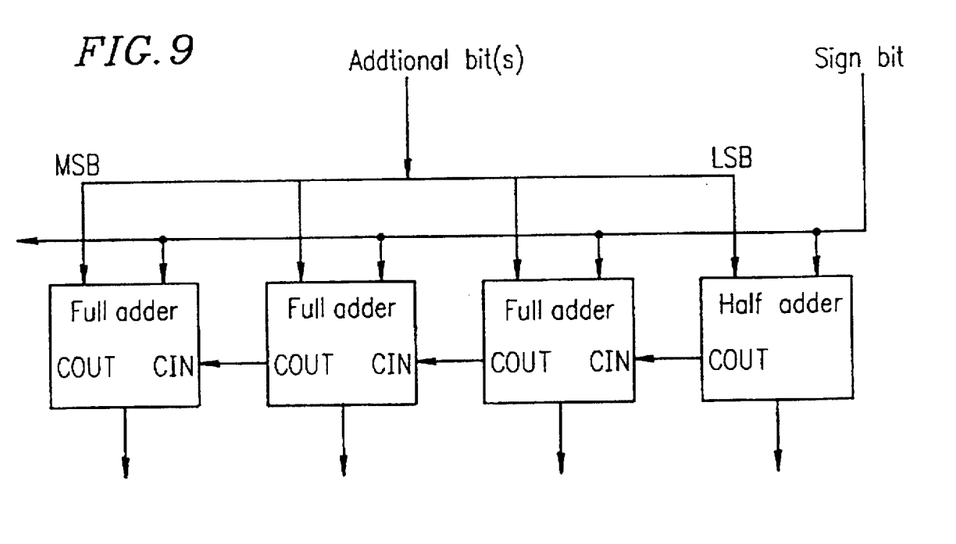
FIG. 9 is a view showing a part of a configuration for an additional bit output section 304 of the variable length encoder 300.

FIG. 9 shows an exemplary configuration for circuit for subtracting a sign bit of the input data 311 from the input data 311. This circuit shown in FIG. 9 is a port of the additional bit output section 304.

The variable length code 314, the bit length of the variable code 315, additional bit(s) 316 and the bit length of additional bit(s) 313 are input to the variable length code output section 305. The variable length code output section 305 outputs a final variable length code 317 which is obtained by combining the variable length code 314 and the additional bit(s) 316 in view of the bit length of the variable length code 315 and the bit length of the additional hit(s) 313.

Thus, as mentioned above, the priority encoder according to the present invention precharges a plurality of word lines during a precharge period, and discharges a selected one word line among the plurality of precharged word lines by switching the switching elements during a discharge period. Alternatively, the priority encoder may discharge a plurality of word lines during a discharge period and precharge a selected one word line among the plurality of discharged word lines by switching the switching elements during a precharge period. This provides a priority encoder having a relatively lower number of logical elements, even when the number of bits of the input data increases.

By combining such a priority encoder with a data storage section for storing data corresponding to a position of bit detected by the .priority encoder, it is possible to improve the speed for outputting data from the data storage section.

In addition, by using the priority encoder according to the present invention in a variable length encoder, it is possible to provide a variable length encoder which improves the circuit scale and operation speed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A priority encoder for encoding input data by scanning the input data in a predetermined direction, comprising:
   a first voltage means for charging a plurality of output lines to a first voltage level;
   a plurality of switching means connected to the plurality of the output lines, each of the plurality of switching means being turned on in accordance with a value of the input data; and
   a second voltage means for charging a selected one of the plurality of output lines to a second voltage level different from the first voltage level, through the switching means which are turned on.

2. A priority encoder according to claim 1, wherein the plurality of switching means includes:
   a first group of switches connected with each other in series, an on/off state of each of the switches in the first group being controlled in accordance with an inverted output of the input data, a switch positioned an end in the first group is connected to the second voltage means; and
   a second group of switches for connecting the first group of switches with the plurality of output lines, an on/off state of each of the switches in the second group being controlled in accordance with a normal output of the input data.

3. A priority encoder according to claim 1, wherein the predetermined direction is one of a direction from a most significant bit to a least significant bit of the input data and a direction from the least significant bit to the most significant bit of the input data.

4. A priority encoder according to claim 1, wherein after the first voltage means precharges the plurality of output lines, the second voltage means discharges the selected one of the plurality of output lines.

5. A priority encoder according to claim 1, wherein after the first voltage means discharges the plurality of output lines, the second voltage means precharges the selected one of the plurality of output lanes.

6. A priority encoder according to claim 1, wherein the switching means includes an NMOS transistor.

7. A priority encoder according to claim 1, further comprising:
   a data storage means connected to the plurality of output lines, for outputting data corresponding to the selected one of the plurality of output lines.

8. A priority encoder for encoding input data by scanning the input data in a predetermined direction, comprising:
   a first encoding means for receiving a portion of the input data and for outputting an encoded result of the portion of the input data;
   a second encoding means for receiving a remaining portion of the input data and for outputting an encoded result of the remaining portion of the input data; and
   a selecting means for selecting one of an output of the first encoding means and an output of the second encoding means based on whether all bits of the portion of the input data have a predetermined value,
   wherein the first encoding means includes:
   a first voltage means for charging a plurality of first output lines to a first voltage level;
   a plurality of first switching means connected to the plurality of the first output lines, each of the plurality of first switching means being turned on in accordance with a value of the portion of the input data;
   a second voltage means for charging a selected one of the plurality of first output lines to a second voltage level different from the first voltage level, through the first switching means which are turned on; and
   a first data storage .means connected to the plurality of first output lines, for outputting data corresponding to the selected one of the plurality of first output lines,
   and wherein the second encoding means includes:
   a third voltage means for charging a plurality of second output lines to a third voltage level;
   a plurality of second switching means connected to the plurality of the second output lines, each of the plurality of second switching means being turned on in accordance with a value of the remaining portion of the input data;
   a fourth voltage means for charging a selected one of the plurality of second output lines to a fourth voltage level different from the third voltage level, through the second switching means which are turned on; and
   a second data storage means connected to the plurality of second output lines, for outputting data corresponding to the selected one of the plurality of second output lines.

9. A priority encoder according to claim 8, wherein the plurality of first switching means includes:
   a first group of switches connected with each other in series, an on/off state of each of the switches in the first group being controlled in accordance with an inverted output of the portion of the input data, a switch positioned at an end in the first group is connected to the second voltage means; and
   a second group of switches for connecting the first group of switches with the plurality of first output lines, an on/off state of each of the switches in the second group being controlled in accordance with a normal output of the portion of the input data, and wherein the plurality of second switching means includes:

a third group of switches connected with each other in series, an on/off state of each of the switches in the third group being controlled in accordance with an inverted output of the remaining portion of the input data, a switch positioned at an end in the third group is connected to the fourth voltage means; and a fourth group of switches for connecting the third group of switches with the plurality of second output lines, an on/off state of each of the switches in the fourth group being controlled in accordance with a normal output of the remaining portion of the input data.

10. A priority encoder according to claim 8, wherein the predetermined direction is one of a direction from a most significant bit to a least significant bit of the input data and a direction from the least significant bit to the most significant bit of the input data.

11. A priority encoder according to claim 8, wherein after the first voltage means precharges the plurality of first output lines, the second voltage means discharges the selected one of the plurality of first output lines.

12. A priority encoder according to claim 8, wherein after the first voltage means discharges the plurality of first output lines, the second voltage means precharges the selected one of the plurality of first output lines.

13. A priority encoder according to claim 8, wherein after the third voltage means precharges the plurality of second output lines, the fourth voltage means discharges the selected one of the plurality of second output lines.

14. A priority encoder according to claim 8, wherein after the third voltage means discharges the plurality of second output lines, the fourth voltage means precharges the selected, one of the plurality of second output lines.

15. A priority encoder according to claim 8, wherein each of the first switching means and the second switching means includes an NMOS transistor.

16. A variable length encoder comprising:

an input means for receiving input data consisting of a plurality of bits;

an absolute value output means for outputting an absolute value of the input data;

a priority encoding means for outputting data including a variable length code, a bit length of the variable length code and a bit length of an additional bit, based on a position of a bit having a predetermined value in the absolute value of the input data;

an additional bit output means for outputting an additional bit based on the input data and the bit length of the additional bit;

variable length code output means for outputting a code obtained by combining the variable length code with the additional bit based on the bit length of the variable length code and the bit length of the additional bit.

wherein the priority encoding means includes:

an encoding means for selectively making one of a plurality of output lines active; and a data storage means connected to the plurality of output lines, for outputting data corresponding to the output line which is made active by the encoding means.

17. A variable length encoder according to claim 16, wherein the additional bit output means includes means for subtracting a sign bit of the input data form the input data.

\* \* \* \* \*